(12) United States Patent
Ikeda et al.

(10) Patent No.: US 12,614,699 B2
(45) Date of Patent: Apr. 28, 2026

(54) PLASMA SOURCE AND PLASMA PROCESSING APPARATUS

(71) Applicant: Tokyo Electron Limited, Tokyo (JP)

(72) Inventors: Taro Ikeda, Yamanashi (JP); Eiki Kamata, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 56 days.

(21) Appl. No.: 18/885,219

(22) Filed: Sep. 13, 2024

(65) Prior Publication Data

US 2025/0104977 A1     Mar. 27, 2025

(30) Foreign Application Priority Data

Sep. 27, 2023     (JP) ................................. 2023-166426

(51) Int. Cl.
*H01J 37/32* (2006.01)

(52) U.S. Cl.
CPC .... *H01J 37/3244* (2013.01); *H01J 37/32082* (2013.01); *H01J 37/32477* (2013.01)

(58) Field of Classification Search
CPC ............. H01J 37/3244; H01J 37/32082; H01J 37/32477
See application file for complete search history.

(56) References Cited

U.S. PATENT DOCUMENTS 7,183,514 B2     2/2007  Kamarehi
9,543,123 B2 *   1/2017  Ikeda ................ H01J 37/32449

10,604,838 B2 *   3/2020   Matsumoto ....... C23C 16/45544
11,562,887 B2 *   1/2023   Koshimizu ....... H01J 37/32706
12,437,972 B2 *  10/2025   Hirayama ......... H01J 37/32256
12,463,013 B2 *  11/2025   Ikeda ................... H01J 37/3222
12,482,631 B2 *  11/2025   Hirayama ......... H01J 37/32082
12,488,964 B2 *  12/2025   Hirayama ......... H01J 37/32532
2004/0182834 A1   9/2004   Kamarehi
2011/0174441 A1 *  7/2011   Yamashita ........ C23C 16/45565
                                                118/723 MP
2014/0060572 A1   3/2014   Yasumuro et al.
2015/0064924 A1 *  3/2015   Takaba ................ H01L 21/0276
                                                438/717

(Continued)

FOREIGN PATENT DOCUMENTS

JP        2006-516806 A     7/2006
JP        2014-049529 A     3/2014

(Continued)

*Primary Examiner* — Adam D Houston
(74) *Attorney, Agent, or Firm* — Fenwick & West LLP

(57)     ABSTRACT

There is provided a plasma source comprising: a housing that defines a plasma generation space; a gas inlet disposed at the housing and configured to introduce a gas; a power supply part disposed at the housing and configured to supply a radio frequency (RF) power; a supply port disposed at the housing and configured to supply active species of plasma produced from the gas in the plasma generation space; a dielectric plate that is disposed at the housing, transmits the RF power from the power supply part to the plasma generation space, and has an opening at a center thereof; a slot formed between the power supply part and the dielectric plate and through which the RF power propagates; and a gas supply line disposed at the housing, and having one end connected to the gas inlet and the other end from which a gas is supplied to the opening.

13 Claims, 5 Drawing Sheets

(56) References Cited

U.S. PATENT DOCUMENTS

| | | | | |
|---|---|---|---|---|
| 2015/0104957 A1* | 4/2015 | Takachi | ............ | H01L 21/30604 |
| | | | | 438/798 |
| 2016/0293386 A1* | 10/2016 | Chen | ................ | H01J 37/32467 |
| 2016/0365261 A1* | 12/2016 | Sant | .................... | H01J 37/3244 |
| 2016/0372299 A1* | 12/2016 | Kubota | ............. | H01J 37/32715 |
| 2020/0219701 A1* | 7/2020 | Koshimizu | ....... | H01J 37/32183 |
| 2020/0219706 A1* | 7/2020 | Koshimizu | ....... | H01J 37/32724 |
| 2021/0407772 A1* | 12/2021 | Koshimizu | ....... | H01J 37/32568 |
| 2022/0037129 A1* | 2/2022 | Koshimizu | ....... | H01J 37/32146 |
| 2022/0044914 A1* | 2/2022 | Fujii | ................. | H01J 37/32183 |
| 2022/0199364 A1* | 6/2022 | Lee | .................... | H01J 37/3222 |
| 2022/0208525 A1* | 6/2022 | Arakelyan | ........ | H01J 37/32532 |
| 2022/0223378 A1* | 7/2022 | Ikuta | ................. | H01J 37/32449 |
| 2023/0091584 A1* | 3/2023 | Torii | ................. | H01J 37/32091 |
| | | | | 315/111.21 |
| 2024/0071730 A1* | 2/2024 | Hirayama | ......... | H01J 37/32623 |
| 2024/0170261 A1* | 5/2024 | Nagorny | .......... | H01J 37/32348 |
| 2024/0321550 A1* | 9/2024 | Hirayama | ......... | H01J 37/32541 |
| 2024/0347321 A1* | 10/2024 | Kobayashi | ........ | H01J 37/32513 |
| 2025/0104977 A1* | 3/2025 | Ikeda | ................. | H01J 37/3244 |
| 2025/0191888 A1* | 6/2025 | Hirayama | ......... | H01J 37/32541 |

FOREIGN PATENT DOCUMENTS

| | | | | | | |
|---|---|---|---|---|---|---|
| JP | 2025098263 | A | * | 7/2025 | ........ | H01J 37/32715 |
| KR | 20250047143 | A | * | 4/2025 | ........ | H01J 37/32642 |
| KR | 102891892 | B1 | * | 11/2025 | ........ | H01J 37/32715 |
| WO | WO 2004/068559 | A2 | | 8/2004 | | |
| WO | WO-2024166772 | A1 | * | 8/2024 | ........ | H01J 37/32715 |
| WO | WO-2025164312 | A1 | * | 8/2025 | ............ | H01L 21/31 |

* cited by examiner

PLASMA SOURCE AND PLASMA PROCESSING APPARATUS

CROSS-REFERENCE TO RELATED APPLICATIONS

This application claims priority to Japanese Patent Application No. 2023-166426 filed on Sep. 27, 2023, the entire contents of which are incorporated herein by reference.

TECHNICAL FIELD

The present disclosure relates to a plasma source and a plasma processing apparatus.

BACKGROUND

For example, Japanese Laid-open Patent Publication No. 2014-49529 proposes a plasma processing apparatus including a remote plasma unit. The remote plasma unit is an inductively coupled plasma source, and defines a plasma generation space at the upper part of the plasma processing apparatus. The remote plasma unit has a coil surrounding the plasma generation space, and a radio frequency (RF) power supply for supplying an RF power is connected to the coil.

For example, Japanese Laid-open Patent Publication No. 2006-516806 provides a helical coil coupled remote plasma generator using a helical coil slow wave structure.

SUMMARY

This disclosure provides a technique capable of scaling down a plasma source.

According to an embodiment of the present disclosure, there is provided a plasma source which comprises: a housing that defines a plasma generation space; a gas inlet disposed at the housing and configured to introduce a gas; a power supply part disposed at the housing and configured to supply a radio frequency (RF) power; a supply port disposed at the housing and configured to supply active species of plasma produced from the gas in the plasma generation space; a dielectric plate that is disposed at the housing, transmits the RF power from the power supply part to the plasma generation space, and has an opening at a center thereof; a slot formed between the power supply part and the dielectric plate and through which the RF power propagates; and a gas supply line disposed at the housing, and having one end connected to the gas inlet and the other end from which a gas is supplied to the opening, wherein the gas supply line and the slot are separated in the housing, and the slot has a deficit portion where the slot is not formed when viewed from above, and the gas supply line is formed at the deficit portion.

DETAILED DESCRIPTION

Figure 1:
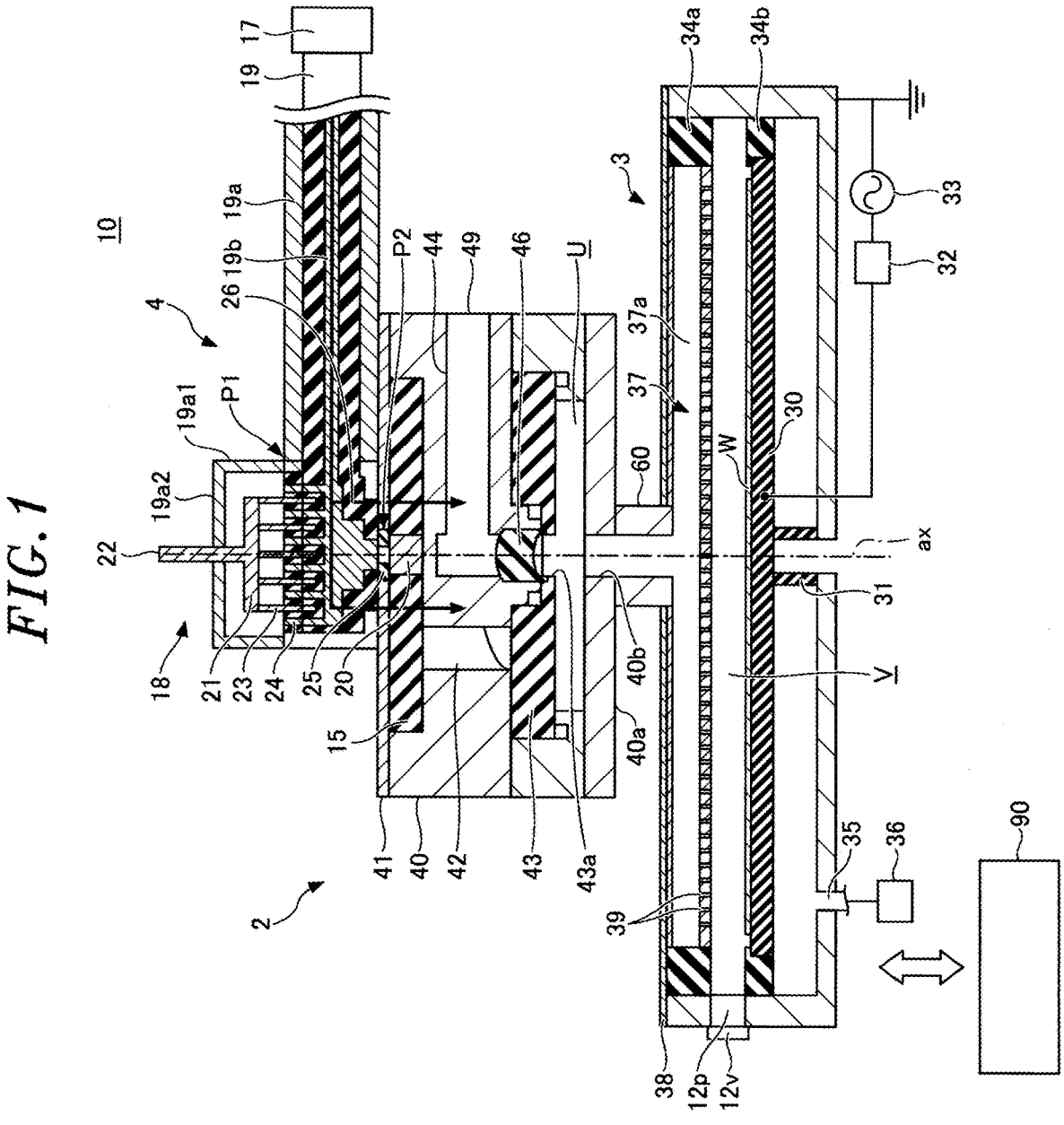
FIG. 1 is a cross-sectional view showing an example of a plasma processing apparatus according to an embodiment.

Hereinafter, the embodiment of the present disclosure will be described with reference to the accompanying drawings.

Like reference numerals will be given to like parts throughout the drawings, and redundant description thereof may be omitted.

(Plasma Processing Apparatus)

A plasma processing apparatus 10 having a plasma source (remote plasma source) according to a first embodiment will be described with reference to FIG. 1. FIG. 1 is a cross-sectional view showing an example of a plasma processing apparatus 10 according to the first embodiment.

The plasma processing apparatus 10 shown in FIG. 1 includes a plasma source 2 and a processing chamber 3. The plasma source 2 is smaller than the processing chamber 3, so that the scale of the plasma source 2 and the processing chamber 3 is ignored in FIG. 1. The plasma source 2 has a housing 40. The housing 40 has a cylindrical shape with a hollow portion, is made of a metal (conductor) such as aluminum or the like. The housing 40 defines a plasma generation space U.

The plasma source 2 and the processing chamber 3 are connected by a connecting portion 60. The plasma source 2, the connecting portion 60, and the processing chamber 3 have an axis ax as a center line. The axis ax is an axis extending in a vertical direction. In the present embodiment, the processing chamber 3 is formed in a cylindrical shape, and has an upper opening. The processing chamber 3 defines a plasma processing space V.

A microwave (radio frequency (RF), electromagnetic wave) power and a gas are supplied into the housing 40, and plasma is produced from the gas by the electric field of the microwave power. The activated species of the produced plasma are supplied to the plasma processing space V in the processing chamber 3 via the connecting portion 60. The activated species transferred from the plasma source 2 to the plasma processing space V may be dissociated again by the RF power applied to the processing chamber 3, and are used for processing the substrate W.

The processing chamber 3 provides a sidewall and a bottom portion. The processing chamber 3 is made of a metal such as aluminum or the like. The processing chamber 3 is grounded. The sidewall of the processing chamber 3 provides a passage 12p. The substrate W is transferred between the inside of the processing chamber 3 and the outside of the processing chamber 3 through the passage 12p. The passage 12p can be opened and closed by a gate valve 12v. The gate valve 12v is disposed along the sidewall of the processing chamber 3.

The processing chamber 3 has a ceiling wall 38. The ceiling wall 38 is made of a metal such as aluminum or the like. The ceiling wall 38 closes the upper opening of the processing chamber 3. The ceiling wall 38 is grounded together with the processing chamber 3.

The bottom portion of the processing chamber 3 provides an exhaust port 35. The exhaust port 35 is connected to an exhaust device 36. The exhaust device 36 includes a pressure controller including an automatic pressure control valve and a vacuum pump such as a turbo molecular pump.

The processing chamber 3 further includes a placing table 30. The placing table 30 is disposed in the processing chamber 3. The placing table 30 is configured to support a substrate W placed thereon. The substrate W is horizontally placed on the placing table 30. The placing table 30 is supported by a support member 31. The support member 31 extends upward from the bottom portion of the processing chamber 3. The placing table 30 and the support member 31 can be made of a dielectric such as aluminum nitride or the like.

The processing chamber 3 has a shower head 37. The shower head 37 is made of a metal such as aluminum or the like. The shower head 37 is formed in a disc shape, and has a hollow structure. The shower head 37 shares the axis ax as the center line thereof. The shower head 37 is disposed above the placing table 30 and under the ceiling wall 38.

The shower head 37 provides a diffusion space 37a therein. The shower head 37 has a plurality of gas holes 39 penetrating from the diffusion space 37a downward in the thickness direction of the shower head 37. The plurality of gas holes 39 are opened on the bottom surface of the shower head 37.

The placing table 30 is provided under the shower head 37. The activated species of the plasma produced in the plasma generation space U are introduced into the plasma processing space V between the shower head 37 and the placing table 30, through the multiple gas holes 39, from the diffusion space 37a in the shower head 37 disposed in the processing chamber 3 via the connecting portion 60. The placing table 30 also serves as a lower electrode, and the shower head 37 also serves as an upper electrode. The shower head 37 may not be provided in the processing chamber 3. In that case, the activated species of the plasma produced in the plasma generation space U are directly supplied to the plasma processing space V through the connecting portion 60.

The periphery of the shower head 37 is covered with a dielectric member 34a such as aluminum oxide. The periphery of the placing table 30 is covered with a dielectric member 34b such as aluminum oxide. If the RF power is not applied to the shower head 37, the dielectric member 34a may not be provided. However, it is preferable to provide the dielectric member 34a in order to define the area of the shower head 37 that functions as the counter electrode of the placing table 30. It is also preferable to provide the dielectric member 34a in order to equalize the ratio of the anode and the cathode of the electrode.

The placing table 30 is connected to a radio frequency (RF) power supply 33 via a matching device 32. The matching device 32 has an impedance matching circuit. The impedance matching circuit is configured to match the impedance of the load (plasma) side to the output impedance of the RF power supply 33. The frequency of the RF power supplied from the RF power supply 33 is lower than the frequency of VHF waves and microwaves supplied to the plasma source 2, and is 60 MHz or less. The frequency of the RF power may be 13.56 MHz. The RF power supply 33 may be connected to the shower head 37, and may supply the RF power to the shower head 37.

(Plasma Source)

Figure 2:
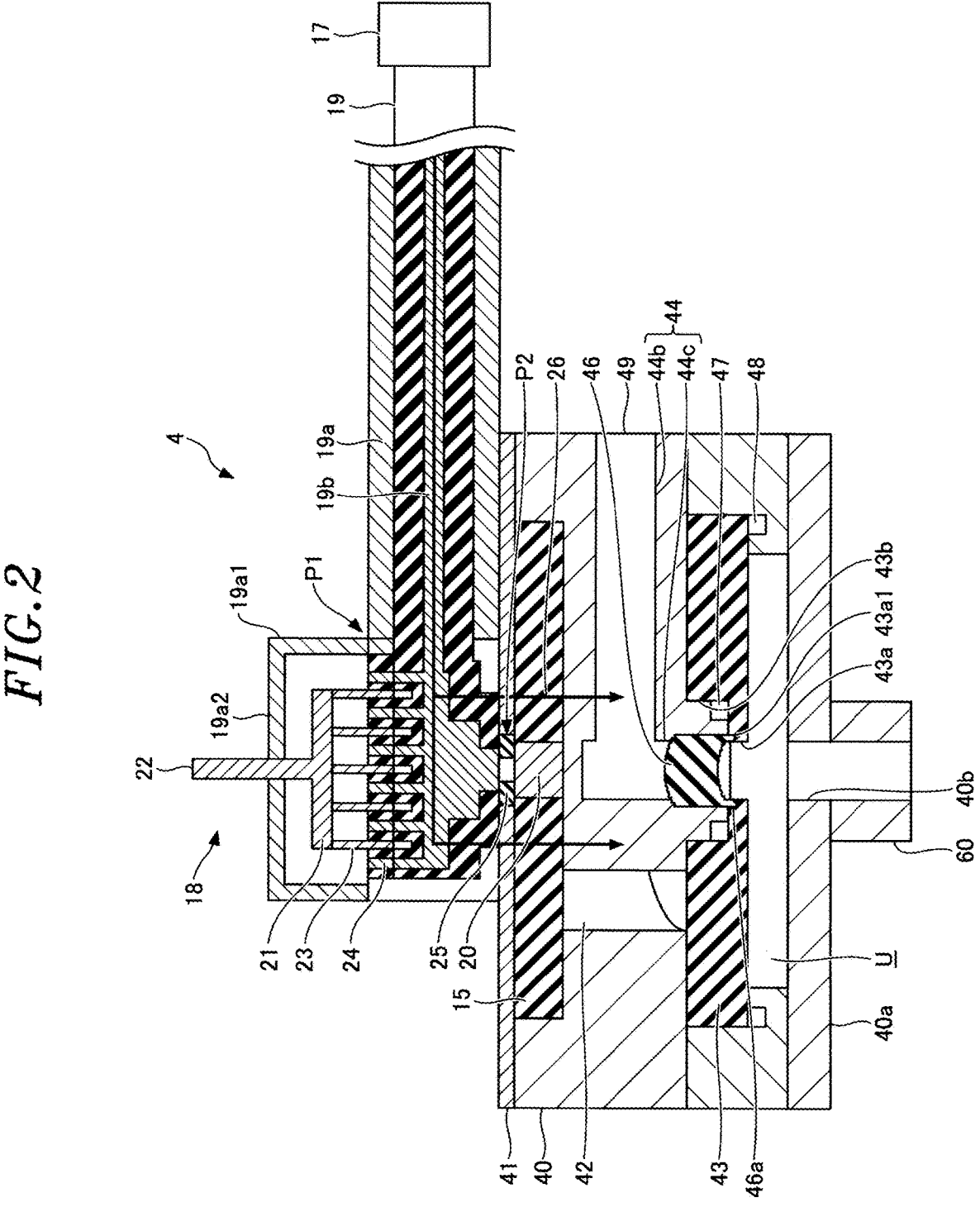
FIG. 2 is a cross-sectional view showing an example of a plasma source according to an embodiment.

The plasma source 2 is placed on the processing chamber 3 via the connecting portion 60. The configuration of the plasma source 2 will be described in detail with reference to FIGS. 1 and 2. FIG. 2 is a cross-sectional view showing an example of the plasma source 2 according to an embodiment, and is an enlarged view of the plasma source 2 shown in FIG. 1.

The plasma source 2 has a housing 40 and an electromagnetic wave supply part 4. The housing 40 has an upper plate 41. The electromagnetic wave supply part 4 is disposed on the upper plate 41 that is a conductor. The electromagnetic wave supply part 4 supplies microwaves into the housing 40. In the present embodiment, the electromagnetic wave supply part 4 supplies a microwave power of 860 MHz as an example of the RF (electromagnetic wave) power.

The electromagnetic wave supply part 4 has a microwave output part 17 and a resonator 18. The microwave output part 17 outputs microwaves. The resonator 18 supplies the microwaves outputted from the microwave output part 17 into the housing 40 through an alumina ring member 25 and a conductive power supply part 20 (hereinafter, both the ring member 25 and the power supply part 20 may be collectively referred to as "power supply part") that are fitted into a cutout portion of the upper plate 41 of the housing 40. The power supply part 20 is disposed in the housing 40, and supplies the RF power into the housing 40.

The microwave output part 17 has a microwave oscillator. The microwave oscillator may be of a magnetron type or a solid-state type. The frequency of the microwaves generated by the microwave oscillator is, e.g., 300 MHz to 300 GHz. For example, the microwave output part 17 outputs microwaves of 860 MHz using a magnetron type microwave oscillator. The microwave output part 17 may be an oscillator that oscillates a radio frequency (electromagnetic waves) in the ultra high frequency (UHF) band.

The waveguide 19 has a coaxial structure including an outer conductor 19a and an inner conductor 19b. The space between the outer conductor 19a and the inner conductor 19b is filled with a dielectric such as poly tetra fluoro ethylene (PTFE). The resonator 18 is connected to the microwave output part 17 via the waveguide 19.

The resonator 18 has a function of matching the impedance of the load (plasma) in the housing 40 to the output impedance of the microwave output part 17. The mode conversion mechanism between the microwave output part 17 and the power supply part 20 is omitted because the resonator 18 has the function of the mode conversion mechanism. The waveguide 19 guides the microwaves outputted from the microwave output part 17 to the resonator 18.

A part of the outer conductor 19a is the housing of the resonator 18, and is kept at ground potential together with the grounded processing chamber 3. The outer conductor 19a has a cylindrical shape, and an input port P1 is formed on a side surface 19a1 of the resonator 18. In the outer conductor 19a, an output port P2 is formed at the end of the cylindrical part near the side where the input port P1 is formed, and the other end 19a2 is formed in a disc shape to close the cylindrical part. A rod-shaped portion 22 for moving a ground fin 21 in the vertical direction in FIGS. 1 and 2 is held at the center of the end 19a2.

The ground fin 21 is made of a conductor such as aluminum or copper. The ground fin 21 has multiple fins 23 and a rod-shaped portion 22. The multiple fins 23 have a concentric columnar shape and a cylindrical shape, for example. The multiple fins 23 have a comb-shaped cross sections shown in FIGS. 1 and 2.

The multiple fins 24 are disposed in the housing of the resonator 18. The multiple fins 24 are triple cylindrical multipole antennas. Further, the multiple fins 24 have a comb-shaped cross section shown in FIGS. 1 and 2.

The inner conductor 19b is connected to the side surfaces of the fins 24. The alumina ring member 25 and the conductor power supply part 20 are arranged near the output port P2. In other words, the inner conductor 19b of the input port P1, the inner conductor 19b of the output port P2, and the fins 24 form a power supply line 26 insulated from the housing of the resonator 18.

The tip ends of the multiple fins 24 are covered with a dielectric such as PTFE or the like. The ground fin 21 is slidable. Even when the ground fin 21 is inserted deepest into the fins 24, the ground fin 21 is not brought into contact with the fins 24. The fins 23 of the ground fin 21 are moved along the dielectric such as PTFE when the insertion amount into the fins 24 is changed. By changing the insertion amount of the ground fin 21 to change the dimension of the resonance space, the frequency (resonance frequency) passing through the resonator 18 can be changed. Accordingly, the impedance matching in the resonator 18 is performed. The ground fin 21 is connected to a driving part such as a motor (not shown), and may be automatically adjusted by the driving part, or may be semi-fixed by a screw.

From the above, the resonator 18 is a comb-shaped resonator having the fins 23 and 24 with comb-shaped cross sections facing each other. The electromagnetic wave supply part 4 may have a comb-shaped resonator, and may supply electromagnetic waves into the housing 40 through the comb-shaped resonator. By providing the comb-shaped resonator in the electromagnetic wave supply part 4, the plasma source 2 can be further scaled down. However, the resonator 18 is not limited to the comb-shaped resonator.

In the housing 40, a disc-shaped (ring-shaped) quartz member 15 is disposed below the upper plate 41. The quartz member 15 has a central opening, and a conductor power supply part 20 is formed in the opening. The resonator 18 is disposed on the power supply part 20. The microwaves propagating through the resonator 18 pass through the ring member 25 and the power supply part 20, penetrate through the quartz member 15, and propagate through the slot 42 below the quartz member 15. The quartz member 15 may not be provided. In this case, the portion around the power supply part 20 where the quartz member 15 exists becomes a space.

Figure 3:
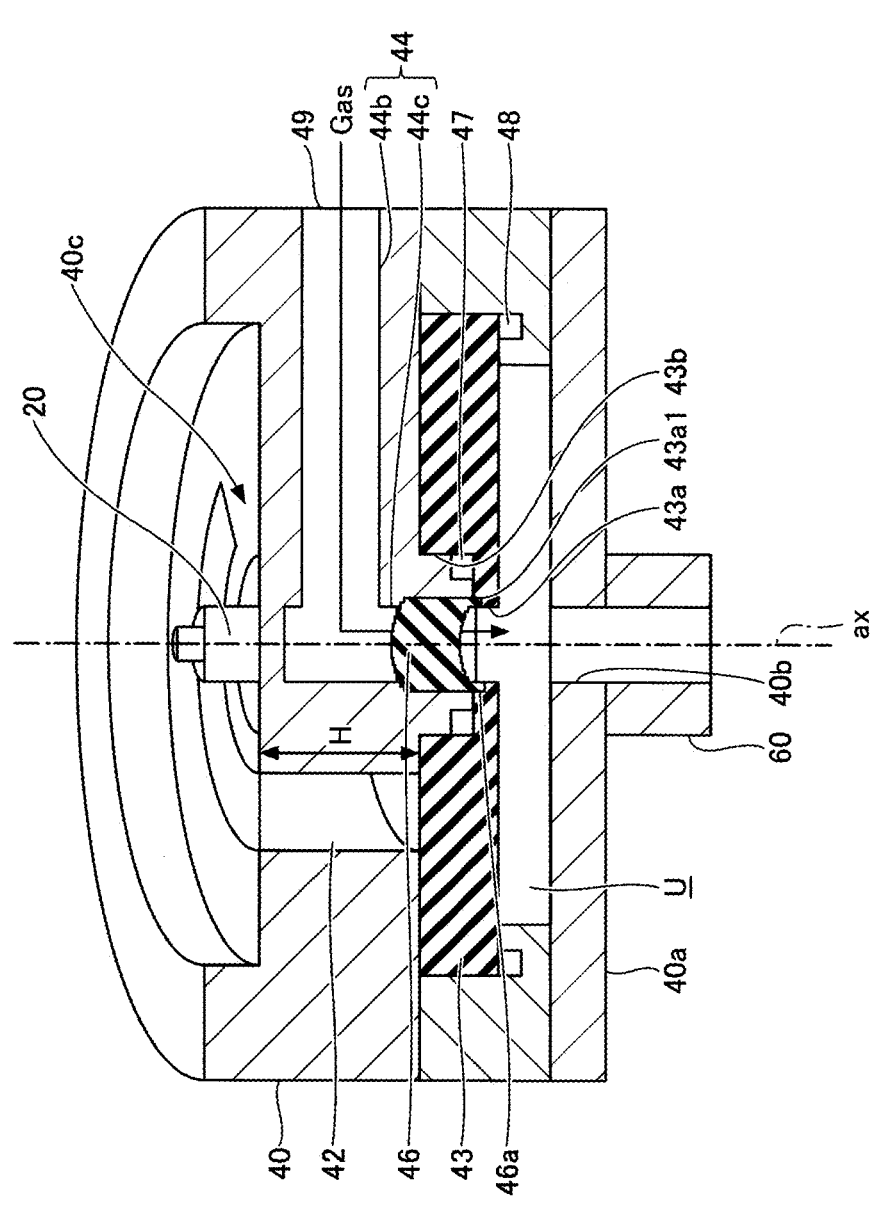
FIG. 3 is a cross-sectional perspective view showing an example of a housing.

FIG. 3 is a cross-sectional perspective view showing an example of the housing 40 when the resonator 18, the upper plate 41, and the quartz member 15 arranged above the housing 40 are separated. In the housing 40, a ring-shaped dielectric plate 43 that transmits microwaves to the plasma generation space U is disposed directly above the plasma generation space U. The dielectric plate 43 is made of, e.g., alumina ($Al_2O_3$) or aluminum nitride (AlN). The dielectric plate 43 has a central opening 43a centered on the axis ax. The outer shape of the dielectric plate 43 is not limited to a circular shape, and may be a rectangular shape. The opening 43a does not necessarily have a circular shape, and may be a polygonal shape such as a quadrilateral shape or the like.

Figure 4:
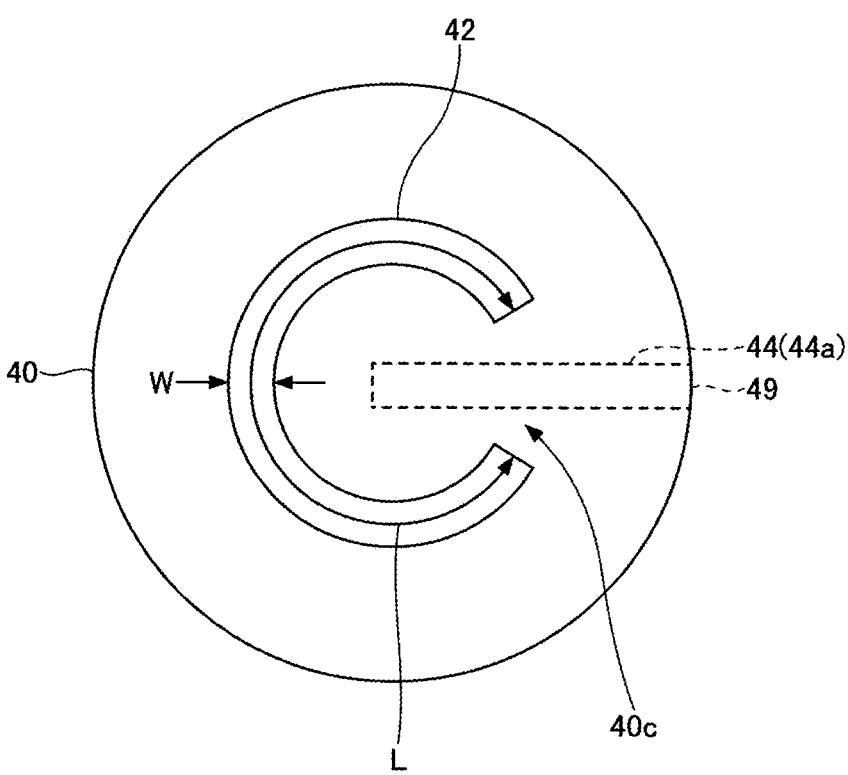
FIG. 4 is a top view of the housing.

The slot 42 is formed between the power supply part 20 and the dielectric plate 43, and microwaves propagate therethrough. As shown in FIGS. 1 and 2, the horizontal width of the dielectric plate 43 is approximately the same as the horizontal width of the quartz member 15, and is greater than the horizontal space of the plasma generation space U. The slot 42 is formed between the dielectric plate 43 and the quartz member 15, and is formed on the inner side than the outermost periphery of the dielectric plate 43 and the outermost periphery of the quartz member 15. FIG. 4 is a top view of the housing 40 shown in FIG. 3. As shown in FIGS. 3 and 4, the slot 42 is formed in the circumferential direction, and has a deficit portion 40c where the slot 42 is not formed when viewed from above. In the present embodiment, the slot 42 is formed in a C shape when viewed from above. The C-shaped end portion of the slot 42 may have a predetermined angle with respect to the gas supply line 44 as shown in FIG. 4, or may be horizontal with respect to the gas supply line 44.

The housing 40 is provided with a gas inlet 49 for introducing a gas. The gas inlet 49 is formed in the sidewall of the housing 40. As shown in FIGS. 3 and 4, the gas supply line 44 is formed at the deficit portion 40c of the housing 40, and has one end connected to the gas inlet 49 and the other end facing the opening 43a. In other words, the gas supply line 44 has a horizontal line 44b extending horizontally from the gas inlet 49 and a vertical line 44c extending vertically toward the opening 43a along the axis ax of the housing 40. The horizontal line 44b and the vertical line 44c are parts of the housing 40.

As shown in FIGS. 1 and 2, the microwaves are outputted from the microwave output part 17, transmit through the quartz member 15 via the resonator 18, the ring member 25, and the power supply part 20, propagate through the slot 42, transmit through the dielectric plate 43, and are radiated into the plasma generation space U.

As shown in FIG. 3, the gas is introduced from the gas inlet 49, flows through the horizontal line 44b of the gas supply line 44, is bent at an angle of 90° at the center of the housing 40, flows through the vertical line 44c toward the opening 43a along the axis ax, and is supplied to the plasma generation space U through the opening 43a.

In the plasma generation space U, plasma is produced from the supplied gas by the electric field of the radiated microwaves. A supply port 40b for supplying active species of plasma produced from the gas in the plasma generation space U is disposed at the center of a bottom portion 40a of the housing 40. The supply port 40b communicates with the internal space of the connecting portion 60. The active species in the plasma produced in the plasma generation space U are supplied from the supply port 40b to the plasma processing space V in the processing chamber 3 via the connecting portion 60.

In this configuration, the gas supply line 44 and the slot 42 are configured separately in the housing 40. When the microwaves propagating through the slot 42 are radiated to the dielectric plate 43, the electric field is concentrated at the opening 43a at the center of the dielectric plate 43. The opening 43a is in direct contact with the gas supplied from the gas supply line 44. Therefore, by flowing the gas through the opening 43a where the electric field is strong, a large amount of radicals are generated near the opening 43a. Accordingly, it is possible to generate high-density plasma with low power consumption.

At the opening 43a where the plasma is strong, damage to the vertical line 44c that is a part of the housing 40 is likely to occur. Therefore, the gas supply line 44 near the opening 43a is covered with a ceramic protective member 46. The protective member 46 is formed in an annular shape, and the inner diameter of the protective member 46 is slightly greater than the diameter of the gas supply line 44. For example, the protective member 46 is made of aluminum nitride (AlN) or alumina ($Al_2O_3$). Aluminum nitride is a material that is difficult to crack, resistant to thermal shock, and does not easily produce oxide particles. Hence, it is more preferable that the protective member 46 is made of aluminum nitride. The protective member 46 is a consumable part, and is replaced regularly or irregularly.

As shown in FIGS. 2 and 3, the opening 43a has an annular stepped portion 43a1 at the corner of the upper part of the inner surface. The protective member 46 is disposed in a recess 43b above the opening 43a of the dielectric plate 43. An end portion 46a of the protective member 46 is fitted into the stepped portion 43a1. Accordingly, the inner surface of the opening 43a and the inner surface of the protective member 46 are formed on the same plane. In other words, the dielectric plate 43 has a shape in which the inner surface of the opening 43a extends to the line of the gas supply line 44 so that the inner surface of the protective member 46 and the inner surface of the opening 43a form the same surface (the entire inner surface of the cylindrical part).

If the end portion 46*a* of the protective member 46 is not fitted into the stepped portion 43*a*1, the plasma in the opening 43*a* is brought into contact with the housing 40 in the recess 43*b* of the dielectric plate 43. Since the housing 40 is made of a metal, the contact between the plasma and the metal causes abnormal discharge near the opening 43*a* or generation of particles. On the contrary, if the end potion 46*a* of the protective member 46 is fitted into the stepped portion 43*a*1, the plasma is prevented from being in contact with the housing 40, thereby generating abnormal discharge or particle generation.

If the end portion of the protective member 46 penetrates through the opening 43*a*, a vertical gap is generated between the protective member 46 and the dielectric plate 43, and particles fall into the plasma generation space U through the gap. In order to prevent this, in the opening 43*a*, the inner surface of the opening 43*a* and the inner surface of the protective member 46 are formed on the same plane, and the end portion of the protective member 46 does not penetrate through the opening 43*a*. Accordingly, it is possible to prevent particles from falling into the plasma generation space U through the gap.

A sealing member 47 such as an O-ring is disposed between the housing 40 and the dielectric plate 43 in the recess 43*b* of the dielectric plate 43. Further, a sealing member 48 such as an O-ring is disposed between the dielectric plate 43 and the housing 40 at the lower outer periphery of the plasma generation space U. Accordingly, the plasma generation space U to be maintained in an airtight state.

The dimensions of the slot 42 will be described. As shown in FIG. 4, a circumferential length L of the slot 42 can be expressed by Eq. (1).

$$L = n \times \lambda/2 \text{(mm)} \pm \lambda/16 \text{(mm)} \qquad \text{Eq. (1)}$$

Here, λ is the wavelength of the microwaves propagating through the slot 42, and n is an integer of 1 or more.

By designing the circumferential length L of the slot 42 to be approximately an integer multiple of λ/2 as shown in Eq. (1), it is possible to radiate microwaves from the slot 42 while utilizing the wave properties of the microwaves.

When a radial width W of the slot 42 is less than 5 mm, abnormal discharge is likely to occur in the slot 42. Further, when the radial width W of the slot 42 is greater than 15 mm, the electric field of the microwaves propagating in the slot 42 becomes weak and, thus, the ignition property, stability, and generation efficiency of the plasma deteriorate. Therefore, the radial width W of the slot 42 is set to be within a range of 10 (mm)+5 (mm).

When a thickness H of the slot 42 shown in FIG. 3 is too thick, it is difficult to transmit the microwaves. For example, if the wave properties of the microwaves are exhibited in the slot 42, the microwaves are attenuated. Therefore, the thickness H of the slot 42 is set to be A/2 or less. Accordingly, the microwaves can propagate to the dielectric plate 43 without attenuation in the slot 42.

The thickness H of the slot 42 is preferably λ/8 or less, and more preferably λ/16 or less. Further, the thickness of the slot 42 may be less than λ/16 as long as it is greater than the vertical width of the gas supply line. If the thickness of the slot 42 is λ/8 or less, the microwaves can reliably propagate in the slot 42 without attenuation.

Accordingly, by setting the circumferential length L of the slot 42 to n×λ/2 (mm)±λ/16 (mm), the microwaves can be radiated into the slot 42, and by setting the thickness of the slot 42 to be less than λ/2, the microwaves can propagate without attenuation.

Figure 5:
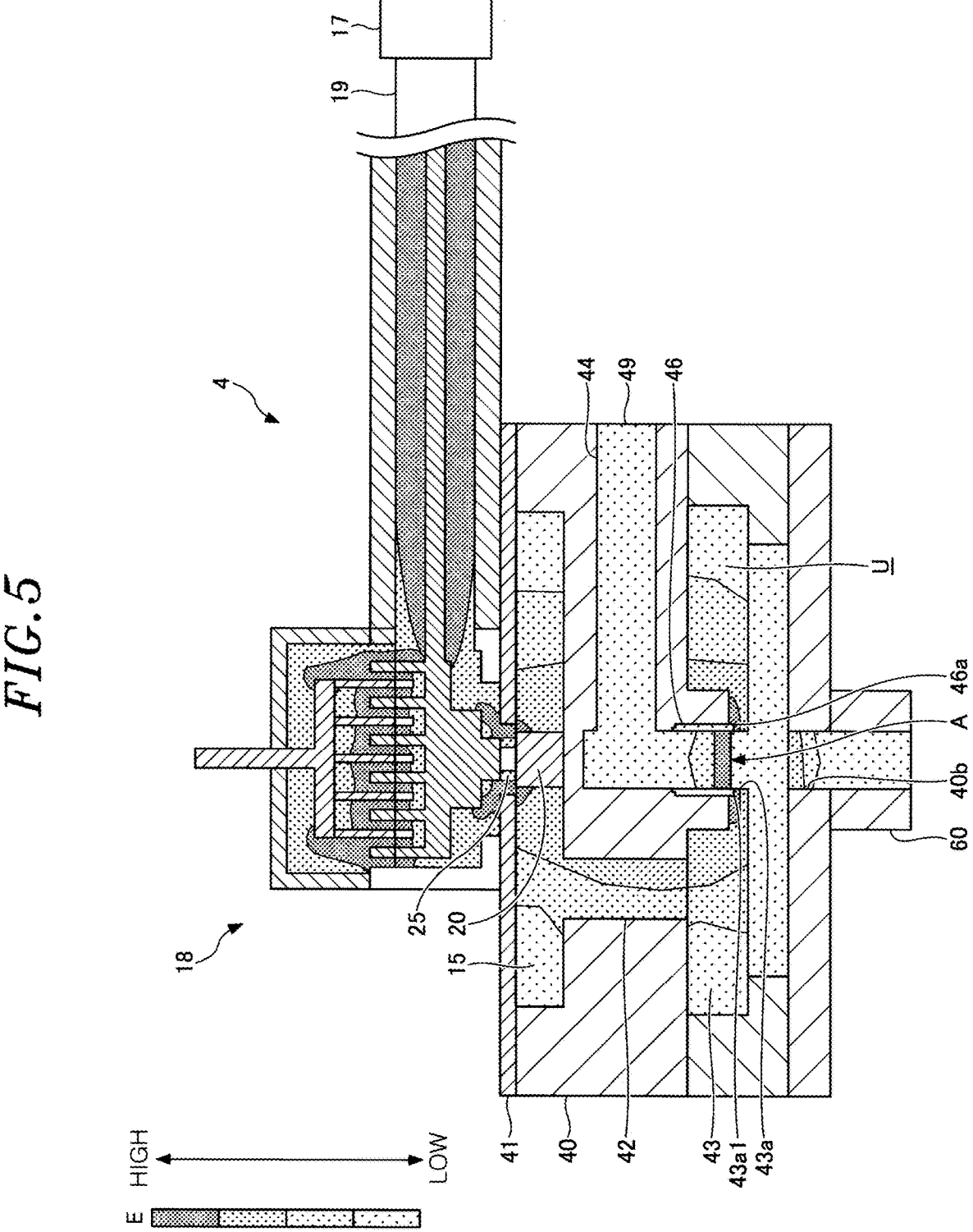
FIG. 5 shows an example of an electric field strength of microwaves.

FIG. 5 shows an example of the electric field intensity of the microwaves propagating through the resonator 18 and the inside of the housing 40. The microwaves are supplied from the resonator 18 to the ring member 25 and the power supply part 20, pass through the quartz member 15, and propagate through the slot 42. The microwaves that have propagated through the slot 42 are radiated to the dielectric plate 43. The dielectric plate 43 transmits the microwaves to the plasma generation space U. When the microwaves are transmitted, the electric field E of the microwaves is concentrated at the opening 43*a* formed at the center of the dielectric plate 43 which is indicated by "A" in FIG. 5.

The opening 43*a* is in direct contact with the gas supplied from the gas supply line 44. Thus, by flowing the gas through the opening 43*a* where the electric field is strong, a large amount of radicals are generated near the opening 43*a*. Accordingly, it is possible to generate high-density plasma with low power consumption while scaling down the plasma source 2.

The active species in the plasma generated in the plasma generation space U are supplied from the supply port 40*b* to the plasma processing space V in the processing chamber 3 through the connecting portion 60.

Effects

The plasma source used in the conventional remote source using ICP plasma is disadvantageous in that the device is structurally large because the frequency of the used RF power is lower than the frequency of the microwaves, and thus cannot meet the demand for miniaturization. If the dimensions of the plasma source itself are large, the plasma source cannot be disposed in the required space, and the application of the plasma source is restricted. In addition, the manufacturing cost of the plasma source increases.

In the case of supplying high-density radicals to a narrow space or line, a large-volume plasma source is inefficient and a large amount of power is required to supply high-density radicals. This is because the generated radicals are likely to disappear while they are being supplied to the space or line. Therefore, a small and efficient plasma source is required such that the plasma generation space can be narrowed and the generated radicals can be released from the plasma source to the processing space (plasma processing chamber) as quickly as possible.

On the other hand, the plasma source used in the remote source of the plasma processing apparatus according to the present embodiment can be scaled down because the wavelength of microwaves is short. Further, the scaling down can be achieved because the gas supply line 44 is formed at the defect portion 40*c* where the slot 42 is not formed. By installing the ring-shaped dielectric plate 43 having the opening 43*a* in the housing 40, the electric field of the microwaves radiated to the dielectric plate 43 can be concentrated at the opening 43*a*. Further, by flowing a gas such as a reducing gas or an etching gas into the opening 43*a* where the electric field is concentrated, radicals can be efficiently generated.

The slot 42 may be empty, or may be filled with a dielectric such as quartz or the like. By filling the slot 42 with a dielectric, the wavelength λ of the microwave propagating through the slot 42 can be shortened. In this case, as long as the circumferential length L of the slot 42 shown in Eq. (1) can be ensured, the slot 42 is not necessarily formed in a C shape when viewed from above. For example, the slot 42 may be formed in the shape of multiple arcs in the circumferential direction when viewed from above, and may have multiple defect portions. Accordingly, multiple gas supply lines can be respectively formed at the multiple defect portions while being separated from the slot 42.

An antenna including a matching device may be used instead of the resonator 18. The antenna has a matching device that matches an impedance. The antenna constitutes a coaxial tube made of a metal material. The outer conductor of the coaxial tube has a cylindrical shape, and the inner conductor has a rod shape or a cylindrical shape. The space between the inner peripheral surface of the outer conductor and the outer peripheral surface of the inner conductor becomes a microwave transmission path. A plurality of ring-shaped dielectrics are arranged in the microwave transmission path, and the dielectrics slide in the microwave transmission path by driving a motor. Accordingly, the matching device performs an impedance matching.

As described above, in accordance with the plasma source and the plasma processing apparatus of the present embodiment, the plasma source can be scaled down.

It should be noted that the plasma source and the plasma processing apparatus according to the embodiments the present disclosure are illustrative in all respects and are not restrictive. The above-described embodiments may be modified and improved in various forms without departing from the scope of the appended claims and the gist thereof. The above-described embodiment may include other configurations without contradicting each other and may be combined without contradicting each other.

The invention claimed is:

1. A plasma source comprising:
   a housing that defines a plasma generation space;
   a gas inlet disposed at the housing and configured to introduce a gas;
   a power supply part disposed at the housing and configured to supply a radio frequency (RF) power;
   a supply port disposed at the housing and configured to supply active species of plasma produced from the gas in the plasma generation space;
   a dielectric plate that is disposed at the housing, transmits the RF power from the power supply part to the plasma generation space, and has an opening at a center thereof;

10 a slot formed between the power supply part and the dielectric plate and through which the RF power propagates; and
   a gas supply line disposed at the housing, and having one end connected to the gas inlet and the other end from which a gas is supplied to the opening,
   wherein the gas supply line and the slot are separated in the housing, and
   the slot has a deficit portion where the slot is not formed when viewed from above, and the gas supply line is formed at the deficit portion.

2. The plasma source of claim 1, wherein the opening is in direct contact with the gas.

3. The plasma source of claim 1, wherein the gas supply line near the opening is covered with a ceramic protective member.

4. The plasma source of claim 3, wherein the opening has a stepped portion at a corner portion, and
   an inner surface of the opening and an inner surface of the protective member are formed on the same plane by fitting an end portion of the protective member into the stepped portion.

5. The plasma source of claim 1, wherein the slot is formed in a C shape when viewed from above.

6. The plasma source of claim 5, wherein a length of the slot in a circumferential direction is n×λ/2 (mm)±λ/16 (mm), where λ is a wavelength of the RF power propagating through the slot, and n is an integer of 1 or more.

7. The plasma source of claim 5, wherein a width of the slot in a radial direction is 10 (mm)±5 (mm).

8. The plasma source of claim 5, wherein the thickness of the slot is less than λ/2, where λ is the wavelength of the RF power propagating through the slot.

9. The plasma source of claim 8, wherein the thickness of the slot is λ/8 or less.

10. The plasma source of claim 1, wherein the power supply part is provided with a resonator.

11. The plasma source of claim 10, wherein the resonator is a comb-shaped resonator.

12. The plasma source of claim 1, wherein the gas inlet is formed on a sidewall of the housing, and
   the gas supply line extends horizontally from the gas inlet in the housing, and extends vertically along the axis of the housing toward the opening.

13. A plasma processing apparatus comprising the plasma source described in claim 1.

* * * * *